(12) United States Patent
Alamouti et al.

(10) Patent No.: US 6,807,240 B2
(45) Date of Patent: *Oct. 19, 2004

(54) LOW COMPLEXITY MAXIMUM LIKELIHOOD DETECTION OF CONCATENATE SPACE CODES FOR WIRELESS APPLICATIONS

(75) Inventors: Siavash Alamouti, Kirkland, WA (US); Patrick Poon, Lamtin (HK); Vahid Tarokh, Hackensack, NJ (US)

(73) Assignee: AT&T Wireless Services, Inc., Redmond, WA (US)

( * ) Notice: Subject to any disclaimer, the term of this patent is extended or adjusted under 35 U.S.C. 154(b) by 44 days.

This patent is subject to a terminal disclaimer.

(21) Appl. No.: 10/005,095

(22) Filed: Dec. 3, 2001

(65) Prior Publication Data

US 2002/0054650 A1 May 9, 2002

Related U.S. Application Data

(63) Continuation of application No. 09/167,422, filed on Oct. 5, 1998, now Pat. No. 6,501,803
(60) Provisional application No. 60/063,794, filed on Oct. 31, 1997.

(51) Int. Cl.[7] .................................................. H03D 1/00
(52) U.S. Cl. ...................... 375/341; 375/267; 375/265; 714/795
(58) Field of Search .................................. 375/316, 341, 375/324, 340, 267, 265; 714/795, 794

(56) References Cited

U.S. PATENT DOCUMENTS

| | | |
|---|---|---|
| 3,633,107 A | 1/1972 | Brady |
| 3,978,408 A | 8/1976 | Gupta et al. |
| 4,001,692 A | 1/1977 | Fenwick et al. |

(List continued on next page.)

FOREIGN PATENT DOCUMENTS

| | | |
|---|---|---|
| CA | 2252664 | 11/1997 |
| CA | 2302289 | 3/1998 |
| CA | 2276207 | 2/2003 |

(List continued on next page.)

OTHER PUBLICATIONS

Seshardri N. et al., "Advanced Techniques for Modulation, Error Correction, Channel Equalization and Diversity," AT&T Tech. Journal 47(4): 48–63, Jul. 1993.

(List continued on next page.)

Primary Examiner—Temesghen Ghebretinsae
(74) Attorney, Agent, or Firm—Perkins Coie LLP

(57) ABSTRACT

Good transmission characteristics are achieved in the presence of fading with a transmitter that employs a trellis coder followed by a block coder. Correspondingly, the receiver comprises a Viterbi decoder followed by a block decoder. Advantageously, the block coder and decoder employ time-space diversity coding which, illustratively, employs two transmitter antennas and one receiver antenna.

19 Claims, 1 Drawing Sheet

U.S. PATENT DOCUMENTS

| | | |
|---|---|---|
| 4,099,121 A | 7/1978 | Fang |
| 4,369,516 A | 1/1983 | Byrns |
| 4,567,464 A | 1/1986 | Siegel et al. |
| 4,577,332 A | 3/1986 | Brenig |
| 4,675,880 A | 6/1987 | Davarian |
| 4,733,402 A | 3/1988 | Monsen |
| 4,763,331 A | 8/1988 | Matsumoto |
| 4,953,183 A | 8/1990 | Bergmans et al. |
| 5,022,053 A | 6/1991 | Chung et al. |
| 5,029,185 A | 7/1991 | Wei |
| 5,088,113 A | 2/1992 | Wei |
| 5,101,501 A | 3/1992 | Gilhousen et al. |
| 5,109,390 A | 4/1992 | Gilhousen et al. |
| 5,202,903 A | 4/1993 | Okanoue |
| 5,283,780 A | 2/1994 | Schuchman et al. |
| 5,305,353 A | 4/1994 | Weerackody |
| 5,319,677 A | 6/1994 | Kim |
| 5,396,518 A | 3/1995 | How |
| 5,416,797 A | 5/1995 | Gilhousen et al. |
| 5,418,798 A | 5/1995 | Wei |
| 5,442,627 A | 8/1995 | Viterbi et al. |
| 5,457,712 A | 10/1995 | Weerackody |
| 5,461,646 A | 10/1995 | Anvari |
| 5,461,696 A | 10/1995 | Frank et al. |
| 5,479,448 A | 12/1995 | Seshadri |
| 5,481,572 A | 1/1996 | Sköld et al. |
| 5,499,272 A | 3/1996 | Bottomley |
| 5,553,102 A | 9/1996 | Jasper et al. |
| 5,675,590 A | 10/1997 | Alamouti |
| 5,790,570 A | 8/1998 | Heegard et al. |
| 5,848,103 A | 12/1998 | Weerackody |
| 5,943,372 A | 8/1999 | Gans et al. |
| 5,949,833 A | 9/1999 | Weerackody |
| 5,960,039 A | 9/1999 | Martin et al. |
| 5,991,331 A | 11/1999 | Chennakeshu et al. |
| 6,034,987 A | 3/2000 | Chennakeshu et al. |
| 6,094,465 A * | 7/2000 | Stein et al. ................. 375/346 |
| 6,115,427 A | 9/2000 | Calderbank et al. |
| 6,144,711 A | 11/2000 | Raleigh et al. |
| 6,185,258 B1 | 2/2001 | Alamouti et al. |
| 6,188,736 B1 | 2/2001 | Lo et al. |
| 6,393,074 B1 * | 5/2002 | Mandyam et al. .......... 375/341 |
| 6,549,585 B2 | 4/2003 | Naguib et al. |
| 6,470,043 B1 | 10/2003 | Lo et al. |

FOREIGN PATENT DOCUMENTS

| | | |
|---|---|---|
| DE | 298 24 760 U1 | 6/2002 |
| DE | 298 24 761 U1 | 6/2002 |
| DE | 298 24 762 U1 | 6/2002 |
| DE | 298 24 763 U1 | 6/2002 |
| DE | 298 24 765 U1 | 6/2002 |
| EP | 0 767 546 A2 | 4/1997 |
| EP | 1 016 228 B1 | 6/2003 |
| GB | 2 280 575 A | 2/1995 |
| GB | 2 290 010 A | 12/1995 |
| GB | 2 311 445 A | 9/1997 |
| WO | WO 91/20142 A1 | 12/1991 |
| WO | WO 95/22214 A1 | 8/1995 |
| WO | WO 97/24849 | 7/1997 |
| WO | WO 97/41670 | 11/1997 |
| WO | WO 98/09385 | 3/1998 |
| WO | WO 99/14871 | 3/1999 |

OTHER PUBLICATIONS

Seshadri N. et al., "Space–Time Codes for Wireless Communication: Code Construction," IEEE 47$^{th}$ Vehicular Technology Cont., Phoenix, pp. 637–641, May 1997.

Tarokh, V., et al., "Space–Time Codes for High Data Rate Wireless Communication: Performance Criteria," IEEE International Conference on Communications, Montreal, 1:299–303, Jun. 1997.

Tarokh, V., et al., "Space–Time Codes for High Data Rate Wireless Communication: Performance Criteria and Code Construction," IEEE Trans on Infor Theory 44(2): 744–765, Mar. 1998.

Alamouti, S., "A Simple Transmit Diversity Technique for Wireless Communications," IEEE Journal on Selected Areas in Communications IEEE 16(8): 1451–1458, Oct. 1998.

Seshadri, N. et al., "Two Signaling Schemes for Improving the Error Performance of FDD Transmission Systems Using Transmitter Antenna Diversity," Proceeding of the 1993 IEEE Vehicular Technology Conference (VTC 43$^{rd}$), pp. 508–511, May 1993.

Winters, J.H., "The Diversity Gain of Transmit Diversity in Wireless Systems with Rayleigh Fading," Proceeding of the 1994 ICC/SUPERCOMM, New Orleans, vol. 2, pp. 1121–1125, May 1994.

Wittneben, A. "A New Bandwidth Efficient Transmit Antenna Modulation Diversity Scheme For Linear Digital Modulation," Proceeding of the 1993 IEEE International Conference on Communications (IICC '93), pp. 1630–1634, May 1993.

Wittneben, A. "Base Station Modulation Diversity for Digital SIMULCAST," Proceeding of the 1991 IEEE Vehicular Technology Conference (VTC 41$^{st}$), pp. 848–853, May 1991.

Blanco, M.A. & Zdunek, K., "Performance and Optimization of Switched Diversity Systems for the Detection of Signals with Rayleigh Fading," IEEE Transactions on Communications, 27(12): 1887–1895, (Dec. 1979).

Blanco, M.A. & Zdunek; K., "On the Optimization of Simple Switched Diversity Receivers," 1978 IEEE Conference on Communications and Power, Montreal, Canada, pp. 114–117, (1978).

Cavers, James K., "An Analysis of Pilot Symbol Assisted Modulation for Rayleigh Fading Channels," IEEE Transactions on Vehicular Technology, Nov. 1991, pp. 686–693, vol. 40, No. 4, The Institute of Electrical and Electronics Engineers, Inc., New York, NY.

Foschini, G.J. and Gans, M.J., "On Limits of Wireless Communications in a Fading Environment when Using Multiple Antennas," Wireless Personal Communications 6: 311–335, (1989).

Foschini, G.J., "Layered Space–Time Architecture for Wireless Communication in a Fading Environment when Using Multi–Element Antennas", Bell Technical Labs Journal, pp. 41–59, (1996).

Hinderling, J. et al., "CDMA Mobile Station Modem ASIC," IEEE 1992 Custom Integrated Circuits Conference pp. 10.2.1–10.2.5, (1992).

Kerr, R. et al., "The CDMA Digital Cellular System: An ASIC Overview," IEEE 1992 Custom Integrated Circuits Conference pp. 10.1.1–10.1.7, (1992).

Nagub, Ayman et al., "A Space–Time Coding Modem for High–Data–Rate Wireless Communications," IEEE Journal On Selected Areas in Communications, Oct. 1998, pp. 1459–1478, The Institute of Electrical and Electronics Engineers, Inc., New York, NY.

Pikholtz, R.L. et al., "Theory of Spread Spectrum Communications –A Tutotial ," *IEEE Transactions on Communications, 30*(5): 855–884, (1992).

Sampei, Seiichi et al., "Rayleigh Fading Compensation Method for 16QAM in Digital Land Mobile Radio Channels," *Proceeding of the 1989 IEEE Vehicular Technology Conference*, May 1989, pp. 640–646, The Institute of Electrical and Electronics Engineers, Inc., New York, NY..

Tarokh, V. et al., "Space Time Codes for High Data Rate Wireless Communication: Performance Criteria in the Presence of Channel Estimation Errors, Mobility, and Multiple Paths", *IEEE Transactions on Communications* 47(2): 199–207, (1999).

Tarokh, Vahid et al., "Combined Array Processing and Space–Time Coding," *IEEE Transactions on Information Theory*, May 1999, pp. 1121–1128, vol. 45, No. 4, The Institute of Electrical and Electronics Engineers, Inc., New York, NY.

Ungerboeck, Gottfried, "Channel Coding with Multilevel/Phase Signals," *IEEE Transactions on Information Theory*, Jan. 1982, pp. 55–67, vol. IT–28, No. 1, The Institute of Electrical and Electronics Engineers, Inc., New York, NY.

Weerackody, V., "Diversity for the Direct–Sequence Spread Spectrum System Using Multiple Transmit Antennas," Proceedings of the IEEE International Conference on Communications, May 23–26, 1993, Geneva, vol. 3, pp. 1775–1779.

Winters, J.H., Salz, J., Gitlin, R.D., "The Impact of Antenna Diversity on the Capacity of Wireless Communications Systems," IEEE Transactions on Communications, vol. 42, No. 2, Feb./Mar./Apr. 1994, pp. 1740–1751, IEEE Communications Society, New York.

* cited by examiner

LOW COMPLEXITY MAXIMUM LIKELIHOOD DETECTION OF CONCATENATE SPACE CODES FOR WIRELESS APPLICATIONS

REFERENCE TO RELATED APPLICATIONS

This application is a continuation of U.S. patent application Ser. No. 09/167,422, filed on Oct. 5, 1998, now U.S. Pat. No. 6,501,803 issued Dec. 31, 2002, which claims the benefit of U.S. Provisional Application No. 60/063,794, filed Oct. 31, 1997.

BACKGROUND OF THE INVENTION

This invention relates to wireless communication and, more particularly, to techniques for effective wireless communication in the presence of fading and other degradations.

The most effective technique for mitigating multipath fading in a wireless radio channel is to cancel the effect of fading at the transmitter by controlling the transmitter's power. That is, if the channel conditions are known at the transmitter (on one side of the link), then the transmitter can pre-distort the signal to overcome the effect of the channel at the receiver (on the other side). However, there are two fundamental problems with this approach. The first problem is the transmitter's dynamic range. For the transmitter to overcome an x dB fade, it must increase its power by x dB which, in most cases, is not practical because of radiation power limitations, and the size and cost of amplifiers. The second problem is that the transmitter does not have any knowledge of the channel as seen by the receiver (except for time division duplex systems, where the transmitter receives power from a known other transmitter over the same channel). Therefore, if one wants to control a transmitter based on channel characteristics, channel information has to be sent from the receiver to the transmitter, which results in throughput degradation and added complexity to both the transmitter and the receiver.

Other effective techniques are time and frequency diversity. Using time interleaving together with coding can provide diversity improvement. The same holds for frequency hopping and spread spectrum. However, time interleaving results in unnecessarily large delays when the channel is slowly varying. Equivalently, frequency diversity techniques are ineffective when the coherence bandwidth of the channel is large (small delay spread).

It is well known that in most scattering environments antenna diversity is the most practical and effective technique for reducing the effect of multipath fading. The classical approach to antenna diversity is to use multiple antennas at the receiver and perform combining (or selection) to improve the quality of the received signal.

The major problem with using the receiver diversity approach in current wireless communication systems, such as IS-136 and GSM, is the cost, size and power consumption constraints of the receivers. For obvious reasons, small size, weight and cost are paramount. The addition of multiple antennas and RF chains (or selection and switching circuits) in receivers is presently not be feasible. As a result, diversity techniques have often been applied only to improve the up-link (receiver to base) transmission quality with multiple antennas (and receivers) at the base station. Since a base station often serves thousands of receivers, it is more economical to add equipment to base stations rather than the receivers.

Recently, some interesting approaches for transmitter diversity have been suggested. A delay diversity scheme was proposed by A. Wittneben in "Base Station Modulation Diversity for Digital SIMULCAST," Proceeding of the 1991 IEEE Vehicular Technology Conference (VTC 41st), PP. 848–853, May 1991, and in "A New Bandwidth Efficient Transmit Antenna Modulation Diversity Scheme For Linear Digital Modulation," in Proceeding of the 1993 IEEE International Conference on Communications (IICC '93), PP. 1630–1634, May 1993. The proposal is for a base station to transmit a sequence of symbols through one antenna, and the same sequence of symbols—but delayed—through another antenna.

U.S. Pat. No. 5,479,448, issued to Nambirajan Seshadri on Dec. 26, 1995, discloses a similar arrangement where a sequence of codes is transmitted through two antennas. The sequence of codes is routed through a cycling switch that directs each code to the various antennas, in succession. Since copies of the same symbol are transmitted through multiple antennas at different times, both space and time diversity are achieved. A maximum likelihood sequence estimator (MLSE) or a minimum mean squared error (MMSE) equalizer is then used to resolve multipath distortion and provide diversity gain. See also N. Seshadri, J. H. Winters, "Two Signaling Schemes for Improving the Error Performance of FDD Transmission Systems Using Transmitter Antenna Diversity." *Proceeding of the 1993 IEEE Vehicular Technology Conference, (VTC 43rd)*, pp. 508–511, May 1993: and J. H. Winters. "The Diversity Gain of Transmit Diversity in Wireless Systems with Rayleigh Fading." *Proceeding of the 1994 ICC/SUPERCOMM. New Orleans, Vol.* 2, PP. 1121–1125. May 1994.

Still another interesting approach is disclosed by Tarokh. Seshadri. Calderbank and Naguib in U.S. application Ser. No. 08/847,635, filed Apr. 25, 1997 (based on a provisional application filed Nov. 7, 1996), where symbols are encoded according to the antennas through which they are simultaneously transmitted, and are decoded using a maximum likelihood decoder. More specifically, the process at the transmitter handles the information in blocks of M1 bits, where M1 is a multiple of M2, i.e. M1=k*M2. It converts each successive group of M2 bits into information symbols (generating thereby k information symbols), encodes each sequence of k information symbols into n channel codes (developing thereby a group of n channel codes for each sequence of k information symbols), and applies each code of a group of codes to a different antenna.

Yet another approach is disclosed by Alamouti and Tarokh in U.S. application Ser. No. 09/074,224, filed May 5, 1998, and titled "Transmitter Diversity Technique for Wireless Communications" where symbols are encoded using only negations and conjugations, and transmitted in a manner that employs channel diversity.

Still another approach is disclosed by the last-mentioned inventors in a U.S. application filed Jul. 14, 1998, based on provisional application No. 60/052,689 filed Jul. 17, 1997, titled "Combined Array Processing and Space-Time Coding" where symbols are divided into groups, where each group is transmitted over a separate group of antennas and is encoded with a group code C that is a member of a product code.

SUMMARY

An advance in the art is realized with a transmitter that employs a trellis coder followed by a block coder. Correspondingly, the receiver comprises a Viterbi decoder followed by a block decoder. Advantageously, the block coder and decoder employ time-space diversity coding which, illustratively, employs two transmitter antennas and one receiver antenna.

DETAIL DESCRIPTION

Figure 1:
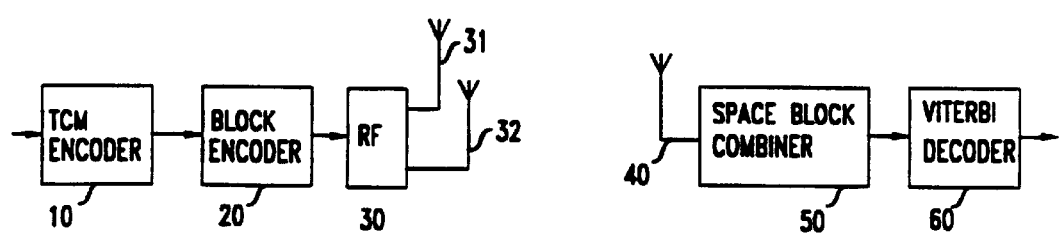
FIG. 1 presents a block diagram of an embodiment in conformance with the principles of this invention.

FIG. 1 presents a block diagram of an arrangement comporting with the principles of this invention. It comprises a trellis code modulation (TCM) encoder 10 followed by a two-branch space block encoder 20. The output is applied to antenna circuitry 30, which feeds antenna 31, and antenna 32. FIG. 1 shows only two antennas, but this is merely illustrative. Arrangements can be had with a larger number of antennas, and it should be understood that the principles disclosed herein apply with equal advantage to such arrangements.

TCM encoder 10 generates complex numbers that represent constellation symbols, and block encoder 20 encodes (adjacent) pairs of symbols in the manner described in the aforementioned Ser. No. 09/074,224 application. That is, symbols $s_0$ and $s_1$, forming a pair, are sent to antenna 31 and antenna 32, respectively, and in the following time period symbols $-s_1^*$ and $s_0^*$ are sent to antennas 31 and 32, respectively. Thereafter, symbols $s_2$ and $s_3$ are sent to antenna 31 and 32, respectively, etc. Thus, encoder 20 creates channel diversity that results from signals traversing from the transmitter to the receiver at different times and over different channels.

The signals transmitted by antennas 31 and 32 are received by a receiver after traversing the airlink and suffering a multiplicative distortion and additive noise. Hence, the received signals at the two consecutive time intervals during which the signals $s_0$, $s_1$, $-s_1^*$, and $s_0^*$ are sent correspond to:

$$r_0(t) = h_0 s_0 + h_1 s_1 + n_0, \tag{1}$$

and $$r_1(t) = h_1 s_1^* - h_0 s_1^* + n_1, \tag{2}$$

where $h_0$ represents the channel from antenna 31, $h_1$ represents the channel from antenna 32, $n_0$ is the received noise at the first time interval, and $n_1$ is the received noise at the second time interval.

The receiver comprises a receive antenna 40, a two-branch space block combiner 50, and a Viterbi decoder 60. The receiver also includes a channel estimator; but since that is perfectly conventional and does not form a part of the invention. FIG. 1 does not explicitly show it. The following assumes that the receiver possesses $\hat{h}_0$ and $\hat{h}_1$, which are estimates of $h_0$ and $h_1$, respectively. Thus, the received signals at the first and second time intervals are combined in element 50 to form signals $$\tilde{s}_0 = \hat{h}_0^* r_0 + \hat{h}_1^* r_1^* \tag{3}$$

and $$\tilde{s}_1 = \hat{h}_1^* r_0 - \hat{h}_0^* r_1^*, \tag{4}$$

and those signals are applied to Viterbi decoder 60.

The Viterbi decoder builds the following metric for the hypothesized branch symbol $s_i$ corresponding to the first transmitted symbol $s_0$:

$$M(s_0,s_i) = d^2[\tilde{s}_0, (|\hat{h}_0|^2 + |\hat{h}_1|^2) s_i]. \tag{5}$$

Similarly, the Viterbi decoder builds the following metric for the hypothesized branch symbol $s_i$ corresponding to the first transmitted symbol $s_1$:

$$M(s_1,s_i) = d^2[\tilde{s}_1, (|\hat{h}_0|^2 + |\hat{h}_1|^2) s_i]. \tag{6}$$

(Additional metrics are similarly constructed in arrangements that employ a larger number of antennas and a correspondingly larger constellation of signals transmitted at any one time.) If Trellis encoder 10 is a multiple TCM encoder, then the Viterbi decoder builds the following metric:

$$M[(s_0,s_1),(s_i,s_j)] = M(s_0,s_i) + M(s_1,s_j). \tag{7}$$

or equivalently, $$M[(s_0,s_1),(s_i,s_j)] = d^2(r_0, \hat{h}_0 s_i + \hat{h}_1 s_j) + d^2(r_1, \hat{h}_1 s_i^* - \hat{h}_0 s_j^*) \tag{8}$$

The Viterbi decoder outputs estimates of the transmitted sequence of signals.

The above presented an illustrative embodiment. However, it should be understood that various modifications and alternations might be made by a skilled artisan without departing from the spirit and scope of this invention.

We claim:

1. In a data communication system employing space diversity via two or more transmitting antennas, a receiver comprising:

a space block combiner configured for receiving data transmitted from the two or more transmitting antennas, and a Viterbi decoder responsive to output signals of the space block combiner.

2. The receiver of claim 1 wherein the combiner combines a frame of received symbols, wherein the frame consists of n time slots and in each time slot concurrently provides m symbols to the combiner.

3. The receiver of claim 2 wherein n=m.

4. The receiver of claim 3 wherein n=m=2.

5. The receiver of claim 2 wherein the combiner develops n signals that represent estimates of signals transmitted by a transmitter.

6. The receiver of claim 1 wherein the Viterbi decoder generates a separate metric for soft decision of a transmitted symbol.

7. The receiver of claims 1 wherein the Viterbi decoder is a multiple trellis code modulation decoder.

8. The receiver of claim 7 wherein the Viterbi decoder develops the metric $M[(s_0,s_1),(s_i,s_j)] = d^2(r_0, \hat{h}_0 s_i + \hat{h}_1 s_j) + d^2(r_1, \hat{h}_1 s_i^* - \hat{h}_0 s_j^*)$, wherein $s_i$ is a hypothesized signal at a first time interval, $s_j$ is a hypothesized signal at a second time interval, $s_0$ is a transmitted signal at the first time interval, $s_1$ is a transmitted signal at the second time interval, $\hat{h}_0$ is an estimate of channel characteristics between a transmitting antenna that transmits signal $s_0$ and a receiving antenna of the receiver, and $\hat{h}_1$ is an estimate of channel characteristics between a transmitting antenna that transmits signal $s_1$ and the receiving antenna of the receiver.

9. The receiver of claim 1 wherein the Viterbi decoder develops the metric $M(s_0,s_1) = d^2[\tilde{s}_0, (|\hat{h}_0|^2 + |\hat{h}_1|^2) s_i]$ to recover the symbol sO, and the metric $M(s_1,s_i) = d^2[\tilde{s}_1, (|\hat{h}_0|^2 + |\hat{h}_1|^2) s_i]$ to recover the symbol s1, where $s_i$ is a hypothesized signal at a first time interval, $s_j$ is a hypothesized signal at a second time interval, $s_0$ is a transmitted signal at the first time interval, $s_1$ is a transmitted signal at the second time interval, $\hat{h}_0$ is an estimate of channel characteristics between a transmitting antenna that transmits signal $s_0$ and a receiving antenna of said receiver, and $\hat{h}_1$ is an estimate of channel characteristics between a transmitting antenna that transmits signal $s_1$ and the receiving antenna of the receiver.

10. The receiver of claim 1 wherein the Viterbi decoder develops the metric $M[(s_0,s_1),(s_i,s_j)]=M(s_0,s_i)+M(s_1,s_j)$, where $M(s_0,s_i)=d^2[\tilde{s}_0,(|\tilde{h}_0|^2+|\tilde{h}_1|^2)s_i]$, $M(s_1,s_i)=d^2[\tilde{s}_1,(|\tilde{h}_0|^2+|\tilde{h}_1|^2)s_i]$, is a hypothesized signal at a first time interval, $s_j$ is a hypothesized signal at a second time interval, $s_0$ is a transmitted signal at the first time interval, $s_1$ is a transmitted signal at the second time interval, $\tilde{h}_0$ is an estimate of channel characteristics between a transmitting antenna that transmits signal $s_0$ and a receiving antenna of said receiver, $\tilde{h}_1$ is an estimate of channel characteristics between a transmitting antenna that transmits signal $s_1$ and the receiving antenna of the receiver, $\tilde{s}_0$ is one signal developed by the combiner, and $\tilde{s}_1$ is another signal developed by the combiner.

11. The receiver of claim 7 wherein the combiner creates signals $\tilde{s}=\tilde{h}_0^*r_0+\tilde{h}_1r_1^*$ and $\tilde{s}=\tilde{h}_1^*r_0-\tilde{h}_0r_1^*$, where $r_0$ is a received signal at one time interval, is a received signal at another time interval, $\tilde{h}_0$ is an estimate of channel characteristics between a transmitting antenna that transmits signal $s_0$ and a receiving antenna of said receiver, and it, $\tilde{h}_1$ is an estimate of channel characteristics between a transmitting antenna that transmits signal $s_1$ and the receiving antenna of the receiver.

12. In a receiver, a method for linking trellis codes with block codes, the method comprising:
receiving on a single receiver antenna, a first baseband signal and a second baseband signal, wherein the first and second baseband signals were transmitted using space-time coding;
determining channel estimates for the received first and second baseband signals;
using the determined channel estimates, generating a first combined signal based on the first received baseband signal and a second combined signal based on the second received signal, the first and second combined signals including a complex multiplicative distortion factor; and
based on the first generated combined signal, building a first metric corresponding to a first hypothesized symbol, the first hypothesized symbol replicating the received first baseband signal prior to transmission; and
based on the second generated combined signal, building a second metric corresponding to a second hypothesized symbol, the second hypothesized symbol replicating the received second baseband signal prior to transmission.

13. The method of claim 12 wherein the first baseband signal and the second baseband signal include noise and interference, including multipath fading.

14. The method of claim 12 wherein the first baseband signal is received at a first time and wherein the second baseband signal is received at a second time.

15. The method of claim 12 wherein the first and second combined signals are generated using a multiple branch space block combiner.

16. In a receiver, an apparatus for linking trellis codes with block codes, the apparatus comprising:
means for receiving on a single receiver antenna, a first baseband signal and a second baseband signal, wherein the received first and second baseband signals were encoded at a transmitter having at least two transmit antennas coupled to an at least two branch trellis encoder;
means, coupled to the means for receiving, for determining channel estimates for the received first and second baseband signals;
means, coupled to the means for determining, for using the determined channel estimates and generating a first combined block signal based on the first received baseband signal and a second combined block signal based on the second received signal, wherein the first and second combined signals include a complex multiplicative distortion factor; and
means for building a combined metric for a hypothesized branch symbol, the hypothesized symbol replicating both the received first and second symbols.

17. The apparatus of claim 16 wherein the first baseband signal and the second baseband signal include noise and interference, including multipath fading.

18. The apparatus of claim 16 wherein the first baseband signal is received at a first time and wherein the second baseband signal is received at a second time.

19. The apparatus of claim 16 wherein the first baseband signal is received via a first frequency and wherein the second baseband signal is received via second frequency.

* * * * *

UNITED STATES PATENT AND TRADEMARK OFFICE
CERTIFICATE OF CORRECTION

PATENT NO. : 6,807,240 B2  
APPLICATION NO. : 10/005095  
DATED : October 19, 2004  
INVENTOR(S) : Siavash Alamouti et al.

It is certified that error appears in the above-identified patent and that said Letters Patent is hereby corrected as shown below:

(54) On the Title page and at col. 1, line 1, please correct the Title to read:

-- LOW COMPLEXITY MAXIMUM LIKELIHOOD DETECTION OF CONCATENATED SPACE CODES FOR WIRELESS APPLICATIONS--

At col. 2, line 33, after "Nov. 7, 1996)," insert -- now U.S. Pat. No. 6,115,427 --.

At col. 2, line 45, after "May 5, 1998," insert -- now U.S. Pat. No. 6,185,258 --.

At col. 2, line 53, after "Jul. 17, 1997," insert -- now U.S. Pat. No. 6,127,971 --.

At col. 3, line 20, delete "Ser. No. 09/074,224 application" and insert therefor --U.S. Pat. No. 6,185,258--.

Signed and Sealed this

Fifth Day of June, 2007

JON W. DUDAS  
*Director of the United States Patent and Trademark Office*